US008451261B2

(12) United States Patent
Yoon

(10) Patent No.: US 8,451,261 B2
(45) Date of Patent: May 28, 2013

(54) LCD DRIVER IC AND METHOD FOR OPERATING THE SAME

(75) Inventor: Jang Hyun Yoon, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 1155 days.

(21) Appl. No.: 12/336,561

(22) Filed: Dec. 17, 2008

(65) Prior Publication Data

US 2009/0167746 A1 Jul. 2, 2009

(30) Foreign Application Priority Data

Dec. 27, 2007 (KR) ........................ 10-2007-0139212

(51) Int. Cl.

| | |
|---|---|
| ***G06F 3/038*** | (2006.01) |
| ***G09G 5/00*** | (2006.01) |
| ***G09G 3/36*** | (2006.01) |
| ***H03L 7/00*** | (2006.01) |

(52) U.S. Cl.

USPC ............. 345/212; 345/211; 345/213; 345/87; 345/98; 345/208; 327/142; 327/143

(58) Field of Classification Search

USPC .............. 345/87, 98, 204, 208–214; 327/142, 327/143; 713/500

See application file for complete search history.

(56) References Cited

U.S. PATENT DOCUMENTS

| | | | | |
|---|---|---|---|---|
| 6,144,238 | A * | 11/2000 | Dasgupta | 327/143 |
| 6,173,436 | B1 * | 1/2001 | Ciccone et al. | 716/55 |
| 7,015,904 | B2 * | 3/2006 | Kim | 345/212 |

FOREIGN PATENT DOCUMENTS

| | | | |
|---|---|---|---|
| JP | 4-204993 | A | 7/1992 |
| JP | 6-049358 | A | 2/1994 |
| JP | 8-304773 | A | 11/1996 |
| JP | 9-171166 | A | 6/1997 |
| JP | 10-142091 | A | 5/1998 |
| JP | 10-170882 | A | 6/1998 |
| JP | 2001-100175 | A | 4/2001 |
| JP | 2002-313925 | | 10/2002 |
| KR | 10-2007-0002955 | | 1/2007 |

OTHER PUBLICATIONS

Office Action dated Sep. 27, 2011 in Japanese Application No. 2008-312132, filed Dec. 8, 2008.

Notice of Allowance dated May 8, 2012 in Japanese Application No. 2008-312132, filed Dec. 8, 2008.

* cited by examiner

*Primary Examiner* — Sumati Lefkowitz
*Assistant Examiner* — David Tung
(74) *Attorney, Agent, or Firm* — Saliwanchik, Lloyd & Eisenschenk

(57) ABSTRACT

Disclosed is an LCD driver IC including: a POR (Power On Reset) circuit; and a counter, which receives a signal from the POR circuit to delay time and releases a RESETB of the POR circuit after power of a gate driver IC is stabilized.

8 Claims, 5 Drawing Sheets

LCD DRIVER IC AND METHOD FOR OPERATING THE SAME

CROSS-REFERENCE TO RELATED APPLICATION

The present application claims the benefit under 35 U.S.C. §119 of Korean Patent Application No. 10-2007-0139212, filed Dec. 27, 2007, which is hereby incorporated by reference in its entirety.

BACKGROUND

Power signals for a liquid crystal display (LCD) panel often include VCC, VSS, VGH (positive gate voltage) and VGL (negative gate voltage). Levels of VCC, VSS, VGH and VGL are set to about 3V, 0V, 20V and −10V, respectively. In order to achieve stable operation of a gate driver IC, power must be applied according to a preset power sequence from the outside. A POR (Power On Reset) circuit is accommodated in the gate driver IC in case the power is not applied according to the preset power sequence due to a specific condition of the LCD panel.

In addition, if a chip (integrated circuit (IC)) output is randomly output due to a random output of a logic in the gate driver IC, excessive current may be applied to an output terminal, thereby causing malfunction of the gate driver IC. In order to prevent such a malfunction, the POR (power on reset) circuit is provided in the gate driver IC.

FIGS. 1 and 2 show POR circuits according to the related art.

Referring to FIG. 1, if the VDD linearly increases according to time, the voltage at Node 1 also linearly increases. When the voltage of Node 1 reaches a threshold voltage of an inverter, a RESETB signal changes from a high state to a low state. However, if noise occurs in the VDD or the rising of VDD is short, the RESETB signal is not properly output, and a Flip Flop (F/F) of an internal circuit does not initialize.

The POR circuit shown in FIG. 2 operates similarly to the POR circuit shown in FIG. 1. FIG. 2 is a view representing a circuit, which is improved over the circuit of FIG. 1 by adding a capacitor such that the RESETB signal is properly output even if the rising of the VDD is short. However, static current may be applied to the circuit. In addition, the RESETB signal may be output before the VGH and VGL are stabilized in the gate driver IC, thereby causing malfunction of the gate driver IC.

FIG. 3 is a view representing a power sequence of power applied to the gate driver IC. As shown FIG. 3, in order to achieve stable operation of the gate driver IC, the RESETB output must be stabilized for a predetermined time after the POR operation. That is, as shown in FIG. 3, time point T1 represents an output point of the RESETB signal of the circuit shown in FIG. 2, and T2 is a desired output point of the RESET. That is, in order to allow the gate driver IC to stably operate, the output T2 of the RESET must be stabilized for a predetermined time (T2−T1) after the operation of the POR starts at the time point T1.

BRIEF SUMMARY

Embodiments of the present invention provide an LCD driver IC and a method for operating the same, capable of inhibiting a TFT gate driver IC from being affected by a power sequence when power is initially applied to the TFT gate driver IC, removing static current of a POR circuit, and/or reducing abnormal operation of the gate IC in the early stage of the operation.

The LCD driver IC according to an embodiment includes a POR (Power On Reset) circuit; and a counter, which receives a signal from the POR circuit to delay time and releases a RESETB signal of the POR circuit after power of a gate driver IC is stabilized.

In addition, a method for operating an LCD driver IC includes the steps of operating a POR circuit; counting signals using a counter until all power of a gate driver IC is stabilized after the operation of the POR circuit; and releasing a RESETB signal of the gate driver IC after all of the power is stabilized.

DETAILED DESCRIPTION

Hereinafter, an LCD driver IC and a method for operating the same according to embodiments of the present invention will be described in detail with reference to accompanying drawings.

Figure 4:
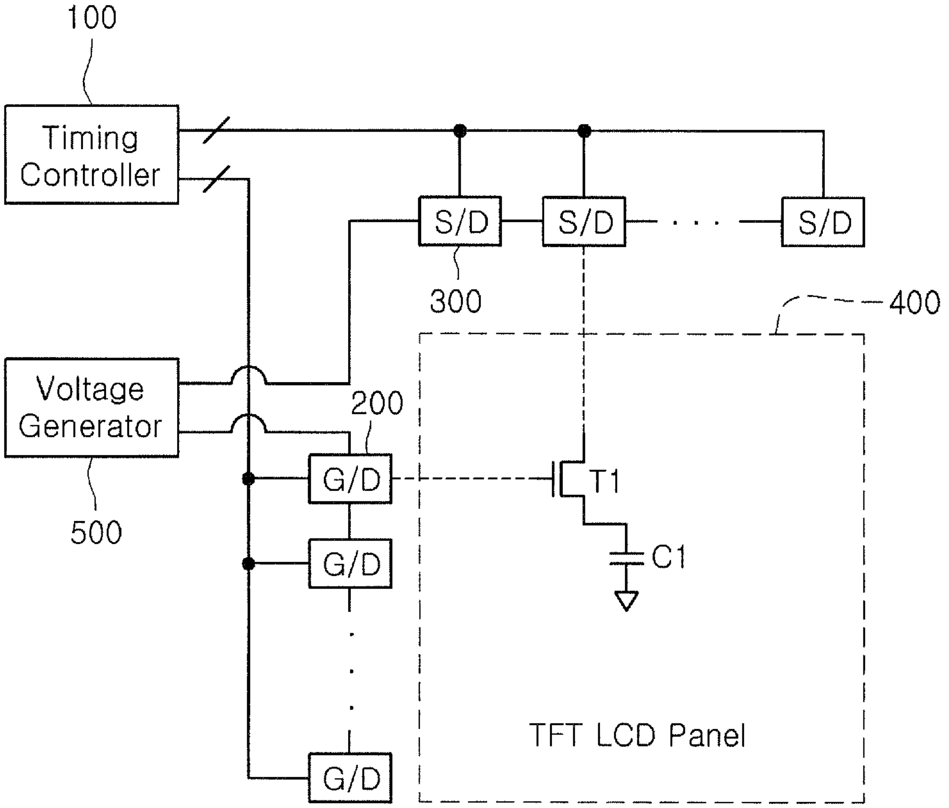
FIG. 4 is a block diagram representing a TFT-LCD employing an LCD driver IC according to an embodiment of the present invention.

FIG. 4 is a block diagram representing a TFT-LCD employing an LCD driver IC according to an embodiment. It should be noted that embodiments are not limited to the TFT-LCD shown in FIG. 4. For example, the LCD driver IC implemented according to the embodiment can include a TFT gate driver IC, but the embodiment is not limited thereto.

As shown in FIG. 4, a TFT-LCD according to an embodiment includes a plurality of gate drivers 200, which are driven by a timing controller 100 to sequentially drive gate lines of a liquid crystal display panel 400; a plurality of source drivers 300, which are driven by the timing controller 100 to drive source lines of the liquid crystal display panel 400 such that the liquid crystal display panel 400 displays data; and a voltage generator 500 for generating various types of voltage required in the system.

The liquid crystal display panel 400 includes a matrix pattern arrangement of unit pixels where each unit pixel is provided with a liquid crystal capacitor C1 and a switching thin film transistor T1. A source of the switching thin film transistor T1 is connected to the source line driven by the source driver 300, and a gate of the thin film transistor T1 is connected to the gate line driven by the gate driver 200.

In the TFT-LCD, the timing controller 100 allows the gate drivers to sequentially drive the corresponding gate lines. In addition, the source driver 300 receives data from the timing controller 100 to apply an analog signal to the source line, so that data is displayed.

Figure 5:
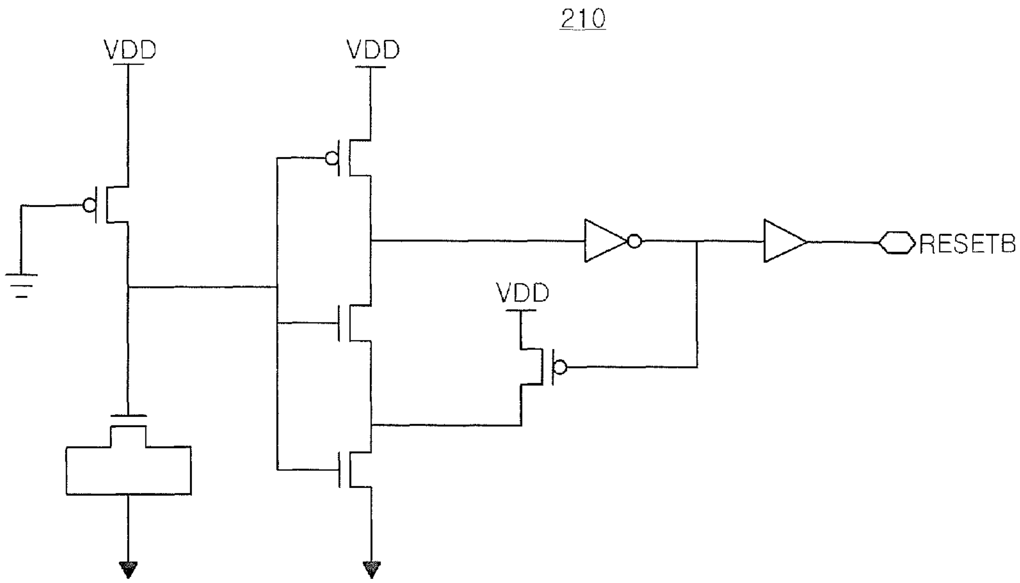
FIG. 5 is a circuit diagram of a POR circuit formed in the LCD driver IC according to an embodiment of the present invention.

FIG. 5 is a circuit diagram of a POR (Power On Reset) circuit 210 formed in the LCD driver IC according to an embodiment of the present invention.

Figure 1:
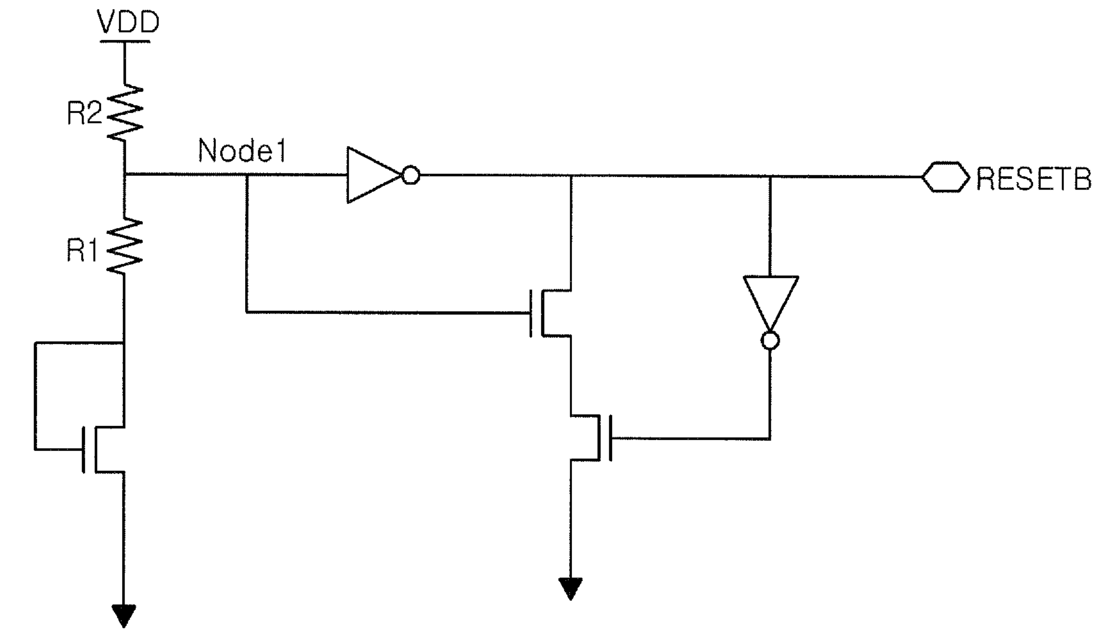
FIGS. 1 and 2 are circuit diagrams of a POR according to the related art.
Figure 2:
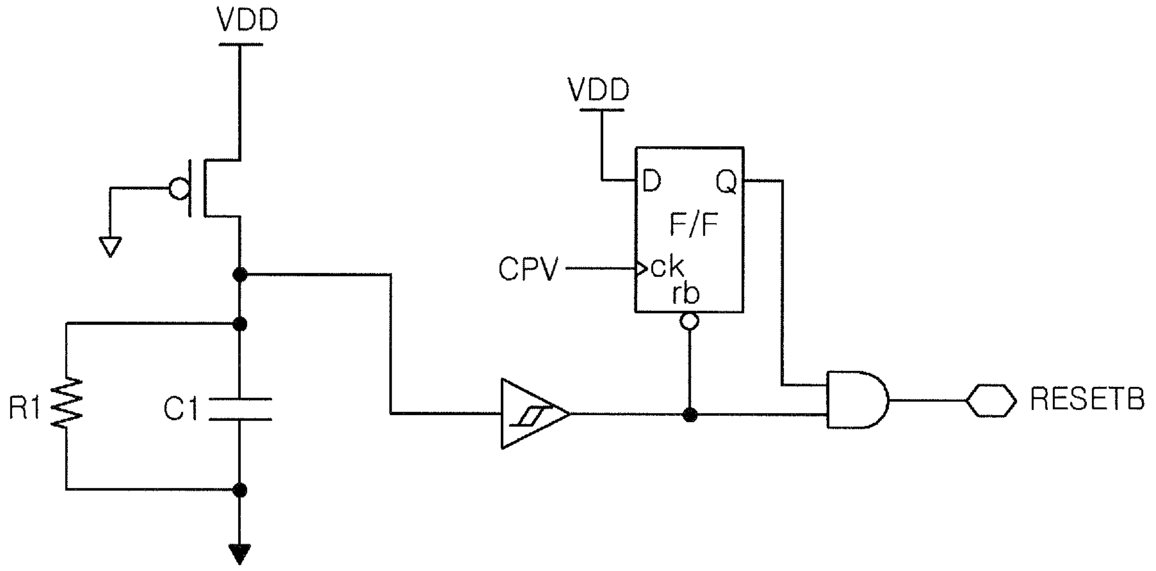
Figure 3:
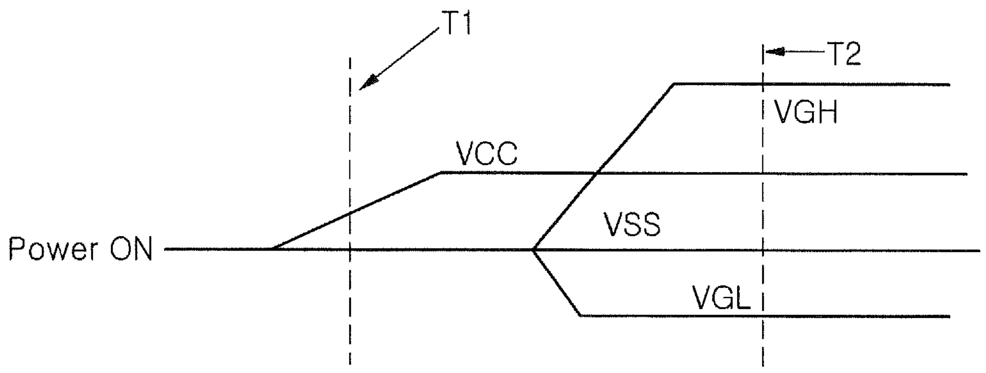
FIG. 3 is a view representing a power sequence of power applied to a gate driver IC according to the related art.

Referring to FIG. 5, according to the POR circuit 210 of the embodiment, static current can be set to 0V to reduce power consumption and a modified schmitt trigger circuit is used to allow the POR circuit 210 to be insensitive to power noise. For example, the resistor R1 (of FIG. 2) is removed to set the static current of the POR circuit 210 to 0V. In addition, as shown in FIG. 5, the number of transistors formed in the POR circuit can be reduced to 4 or less transistors, to contribute to the insensitivity of the POR circuit 210 to power noise.

Figure 6:
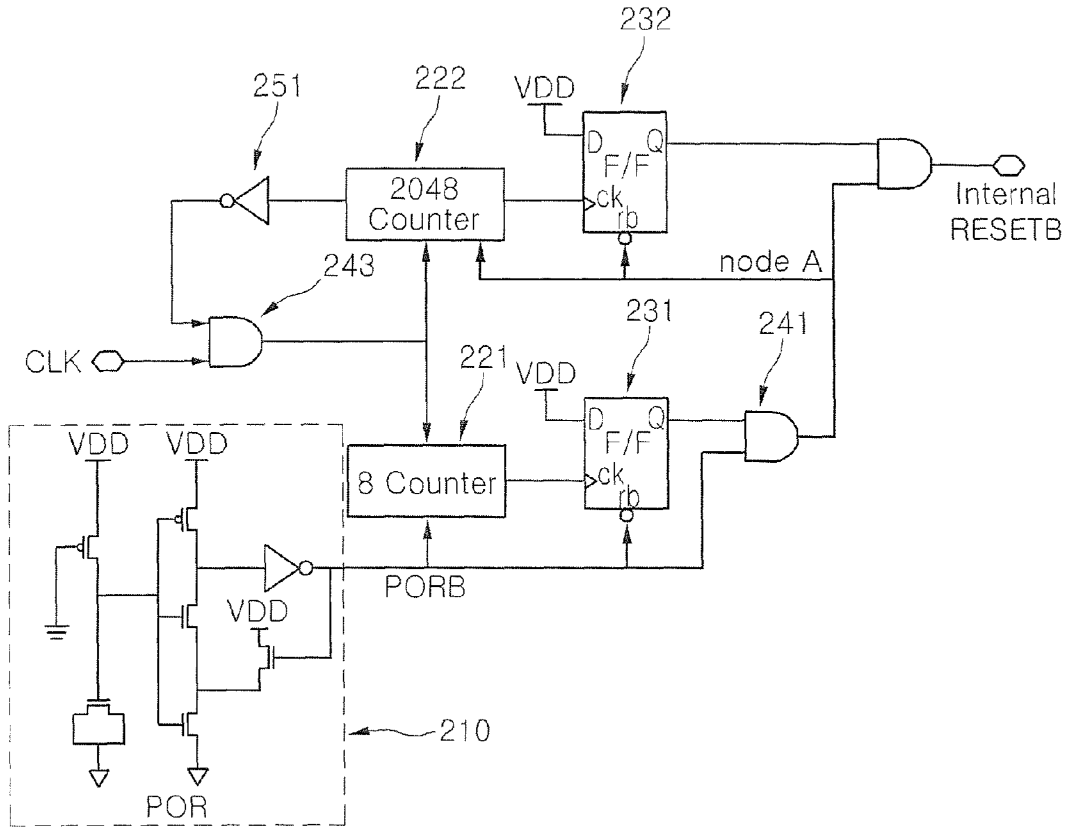
FIG. 6 is a circuit diagram of the POR circuit formed in the LCD driver IC including added counter circuits according to an embodiment of the present invention.

FIG. 6 is a circuit diagram in which counter circuits 221 and 222 are added to the POR circuit 210 formed in the LCD driver IC according to an embodiment of the present invention.

That is, FIG. 6 is a view representing a circuit, in which the counter circuits 221 and 222 are added to the POR circuit 210 such that a RESETB signal of the gate driver IC can be output after VGH and VGL are stabilized.

Figure 7:
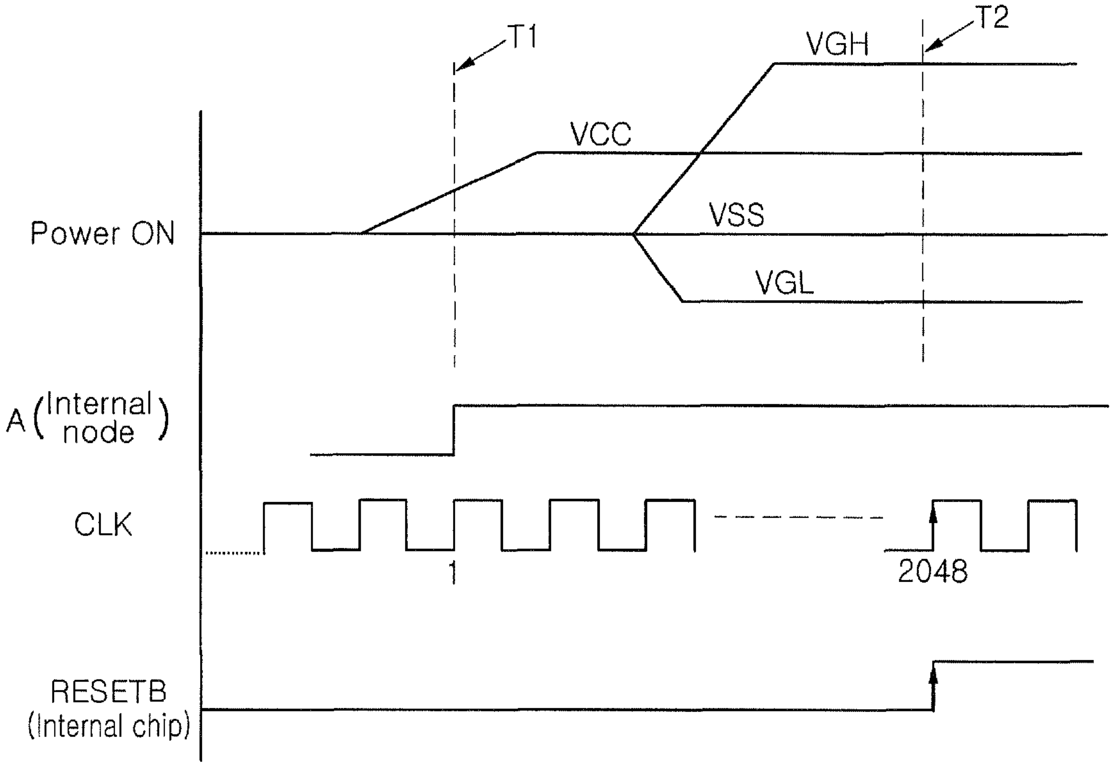
FIG. 7 is a schematic view representing a method for operating the LCD driver IC according to a power sequence of an embodiment of the present invention.

FIG. 7 is a schematic view representing a method for operating the LCD driver IC in accordance with an embodiment of the present invention.

As mentioned above, when power is applied to the liquid crystal display panel 400, an output of the gate driver IC may be randomly output, so that a screen exhibits an abnormal image for a short period of time. In addition, an output terminal of the gate driver IC tends to consume large quantity of current, thereby causing a malfunction of the gate driver IC.

In order to solve the above problem, embodiments of the present invention employ a POR (Power On Reset) circuit 210 and counters 221 and 222 to set the output of the gate driver IC to a VGL state during a 3-frame time as shown in FIG. 7. According to an embodiment, the 3-frame time involves a first time frame through which the RESETB signal is provided, a second time frame created by a first counter delay, and a third time frame created by a second counter delay, such that the internal chip RESETB signal is released after the third time frame to allow the output of the gate driver IC to be set to the VGL state. Accordingly, the malfunction of a module is inhibited without performing masking work for a gate output using a GOE (Gate-Out-Enable) signal during a Power-on.

Hereinafter, an operation of a liquid crystal display according to an embodiment will be described in detail with reference to FIGS. 6 and 7.

As shown in FIG. 7, an internal chip RESETB signal is released after all the signals are stabilized. The power signals can include VDD (VCC and VSS), VGL and VGH. To this end, after the POR circuit 210 starts operation by the power-on of VDD, an internal counter receives the RESETB signal (PORB) from the POR circuit 210 to delay time, and then releases the chip RESETB (Internal chip RESETB) after all of the power signals are stabilized.

For example, if VDD increases over time in the early stage of the operation of the liquid crystal display, the POR circuit 210 detects a voltage level of VDD, so that a PORB signal is maintained in a GND level and then increased up to a VDD level upon reaching a threshold value.

A first counter (8 Counter) 221 and a first flip flop 231 are reset by the PORB signal so that the first counter (8 Counter) 221 and the first flip flop 231 have initial values thereof.

After the first counter 221 is initialized by the PORB signal, the first counter 221 counts signals. When 8 divider signals of an input clock CLK are counted, an output of the first counter 221 is applied to a clock input terminal of the first flip flop 231, so that an output of the first flip flop 231 becomes high.

Since VDD is applied to an input terminal of the first flip flop 231, if the clock input terminal becomes high, the first flip flop 231 outputs a high VDD.

The output of the first flip flop 231 is applied to a first input terminal of a first AND gate (2 input-AND gate) 241, and a second input terminal of the first AND gate (2 input-AND gate) 241 receives a high PORB signal.

Accordingly, an output of the first AND gate (2 input-AND gate) 241 (internal node 'A') becomes high, and is applied to a second counter (2048 Counter) 222 and a second flip flop 232 to release the reset of the second counter (2048 Counter) 222 and the flip flop 232. This may occur at T1.

After the reset is released, the second counter 222 counts signals. When 2048 divider signals of the input clock CLK are counted, an output of a second counter 222 is input into a clock input terminal of the second flip flop 232, so that an output of the first flip flop 232 turns from a GND level to a high VDD. Accordingly, the internal chip RESETB signal can be released (in a high state) at T2.

When the output of the second counter 222 becomes high, the output is used to reset the first and second counters 221 and 222. This is accomplished by using an inverter 251 connecting to one input of a second AND gate 243 where the second input of the second AND gate 243 receives the input clock CLK. The signal input into the first and second counters 221 and 222 allows the first and second counters 221 and 222 to be reset, so that the operation of the counters 221 and 222 is stopped. As a result power consumption is reduced.

Even though the operation of the counters 221 and 222 is stopped, since the flip flop circuit serves as a memory, the Internal RESETB signal representing an output signal maintains a high state.

Hereinafter, an operation of the liquid crystal display will be described with reference to FIGS. 4 and 7.

First, if VDD is applied in a state that a CVP clock (gate clock signal) of the timing controller 100 is applied to the gate driver 200, VCC rises depending on a capacity of a DC/DC converter.

After that, when VCC reaches a voltage level about 1.5V, an internal POR logic starts operation, so that a signal 'A' (see FIG. 7) of the logic becomes high. This can occur at a time T1.

Then, after the signal 'A' becomes high, the internal counter starts to count signals such that the F/F (flip flop) in the chip is released after the counting of the 2048 CPV clock signals is completed. Before the release of the F/F (flip flop), all of channels can maintain a reset state in such a manner that a gate output represents a low state.

That is, in the early stage of VDD application, the gate output (from gate driver 200) maintains in the low state (VGL) by 'A'. In the late stage of VDD application, the gate output maintains in the low stage before the 2048 CPV clock signals are counted.

After the chip reset is released, the RESETB maintains the high state until VDD is shutoff, so that the gate driver IC 200 normally operates.

As shown in FIG. 7, after an inner reset (e.g. signal 'A') is released and then a 2048 dummy clock is input, a reset of the POR circuit 210 is released. After the reset of the POR circuit 210 is released, a shifter register starts operation.

The number of the CPV clock signals is set to 2048 such that the output of the gate driver IC is output after about a 3-frame time. Although 2048 is described as the number of the CPV clock signals, the number of the CPV clock signals is not limited to that disclosed in the embodiment.

According to the LCD driver IC and the method for operating the same in accordance with embodiments, since a resistor is not installed, static current is set to 0V, so that the consumption of static current is reduced in the POR circuit.

In addition, according to the embodiment, a counter circuit is added, so that an internal RESETB of the gate driver IC is output after VGH and VGL are stabilized. As a result, a stable RESET signal is output, thereby reducing malfunction of the chip.

Further, according to an embodiment, a counter circuit is added, so that the stable RESET signal can be output regardless of the power sequence.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An LCD driver IC, comprising:

a POR (Power On Reset) circuit; and a counter circuit, which receives a signal from the POR circuit to delay time and releases a RESETB output signal of the POR circuit after power of a gate driver IC is stabilized:

wherein the counter circuit comprises:

a first counter receiving the signal, from the POR circuit to delay for a first time;

a first flip flop, wherein an output of the first counter is connected to a clock input of the first flip flop;

a first AND gate, wherein an output of the first flip flop is connected to a first input of the first AND gate and the signal from the POR circuit is connected to a second input of the first AND Gate;

a second counter receiving an output from the first AND gate to delay for a second time; and a second flip flop, wherein an output of the second counter is connected to a clock input of the second flip flop, wherein after the second delay, an output of the second flip flop releases the RESETB output signal.

2. The LCD driver IC according to claim 1, wherein the counter circuit allows an output of the gate driver chip to maintain a VGL state during a 3-frame time.

3. The LCD driver IC according to claim 2, wherein the output of the gate driver IC maintains the VGL state while 2048 CPV clock signals (gate clock signal) are being counted by a counter of the counter circuit.

4. The LCD driver IC according to claim 1, the counter circuit outputs a RESETB for the gate driver IC after VGH and VGL are stabilized.

5. The LCD driver IC according to claim 1, wherein a static current of the POR circuit is zero.

6. The LCD driver IC according to claim 5, wherein the POR circuit comprises a four transistor modified schmitt trigger.

7. The LCD driver IC according to claim 1, wherein the first counter is an 8 Counter and the second counter is a 2048 Counter.

8. The LCD driver IC according to claim 1, further comprising:

an inverter receiving the output of the second counter; and a second AND gate, wherein a first input of the second AND gate receives a CLK signal and a second input of the second AND gate receives an output of the inverter, wherein an output of the second AND gate is connected to the first counter and the second counter to reset the first and second counters.

* * * * *